VAPOR-PLATED CERMET RESISTER
Original Filed Jan. 26, 1968
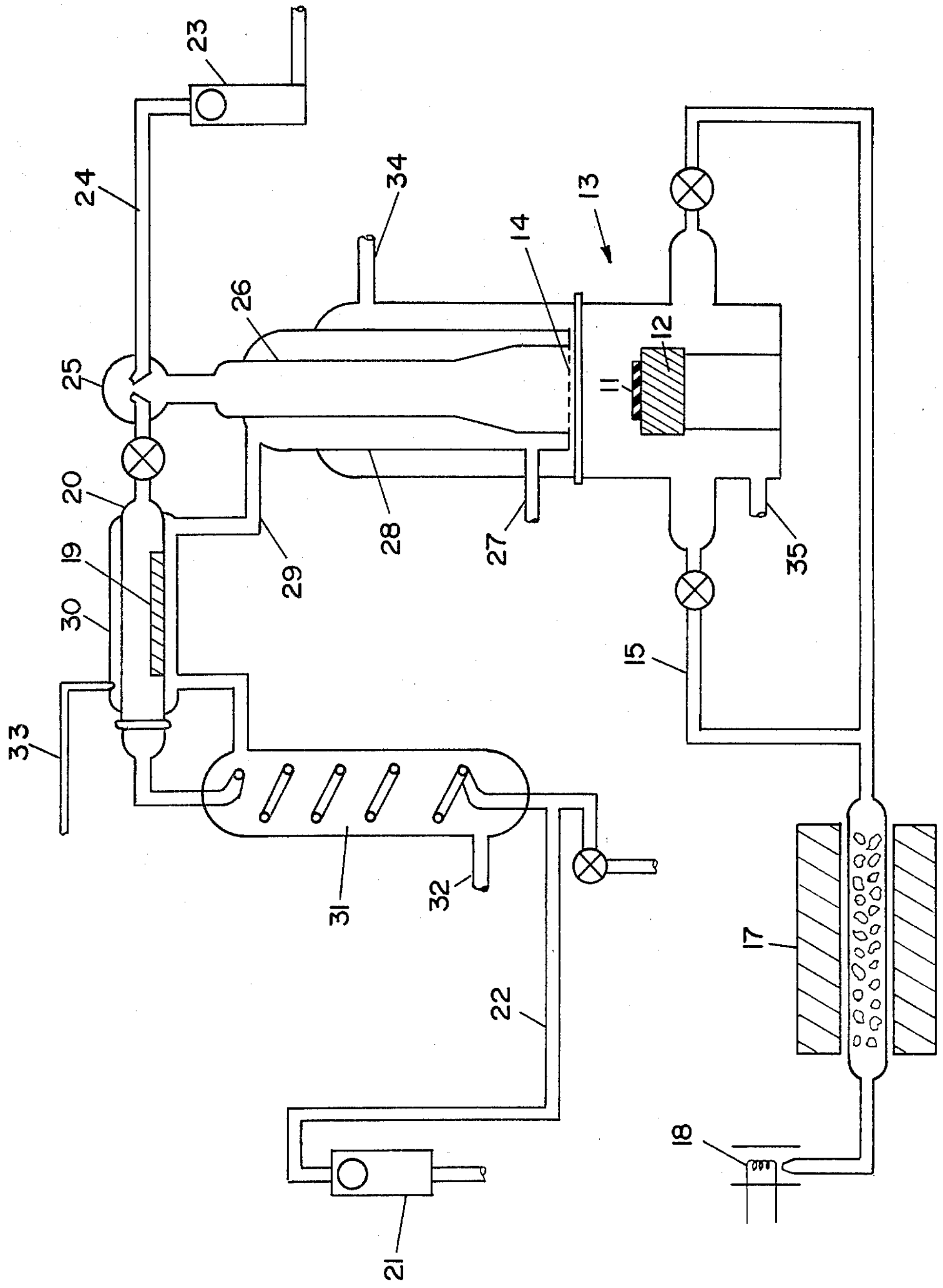
INVENTOR.
Warren L. Brand
BY
Mueller, Aichele, & Rauner
Att'ys United States Patent Office
3,669,737
Patented June 13, 1972

3,669,737
VAPOR-PLATED CERMET RESISTOR
Warren L. Brand, 942 Ponderosa, Apt. 36, Sunnyvale, Calif. 94086
Continuation of application Ser. No. 700,817, Jan. 26, 1968. This application Sept. 28, 1970, Ser. No. 76,332
Int. Cl. B44d *1/18*; H01c *7/00*
U.S. Cl. 117—227 2 Claims

ABSTRACT OF THE DISCLOSURE

A tungsten-tungsten oxide electrical resistance film is deposited by passing a gaseous mixture containing oxygen and tungsten hexacarbonyl vapor in contact with a suitable substrate maintained at a temperature sufficiently high to decompose the carbonyl vapor. The sheet resistance of the deposited film can be varied from 50 ohms per square to 5,000 ohms per square by controlling the molar ratio of oxygen to tungsten hexacarbonyl, thereby determining the ratio of tungsten to tungsten oxide in the cermet film. The film is particularly suited for use as a resistor in the fabrication of integrated circuits, and is compatible with diffused active components of semiconductor devices.

CROSS REFERENCE TO A RELATED APPLICATION

This is a continuation of application Ser. No. 700,817, filed Jan. 26, 1968, now abandoned.

The invention herein described was made in the course of, or under a contract or sub-contract thereunder with the Navy Department, Bureau of Ships Electronics Divisions.

BACKGROUND OF THE INVENTION

This invention relates to the fabrication of thin film resistors and is directed primarily to a method for the pyrolytic deposition of thin film cermet resistors in the fabrication of micro-electronic devices, including, for example, semiconductor integrated circuits.

In the development of a high resistance thin film structure for integration into a monolithic semiconductor device, there are at least four compatibility restraints to be considered. First, the resistance film must adhere well to silicon dioxide glass and be compatible therewith. Second, the composition must be compatible with aluminum, since aluminum is generally employed to make ohmic contacts to the active circuit components of the integrated structure. Third, the film must be amenable to patterning by photoresist and chemical etching techniques. Fourth, the resistor film and associated connecting conductors must be capable of withstanding a high temperature reliability test without degradation; for example, one half hour at 450° C. in an oxygen bearing atmosphere.

In the fabrication of a monolithic integrated circuit a thin film resistance layer is usually deposited directly upon the silicon dioxide layer covering the semiconductor wafer into which one or more active circuit components are previously formed, for example, by diffusing techniques. The desired geometry of the thin film is then achieved by selective etching procedures. Another insulating layer is then deposited over the resistor or resistors, followed by etching to provide apertures for ohmic contacts. The contact metal is generally evaporated over the insulating layer and through the apertures in contact with the resistance element. The metal is then removed from all but the desired areas by means of masked etching.

A number of materials have been available for use in the fabrication of thin film resistors. For example, tin oxide has been used to provide films having sheet resistance values ranging from 80 to 4,000 ohms per square, obtained by doping the film with varying amounts of indium or antimony during the deposition process. The temperature coefficient of resistivity (TCR) for such films ranges from 0 to −1500 parts per million per degree centigrade.

Tantalum film resistors have been deposited by sputtering techniques, but have not been found satisfactory or adequate for many purposes. Vacuum evaporated chromium films adhere well to metals and to glass but their resistivity is low and they have a poor temperature coefficient.

A Nichrome alloy has been found suitable for thin film resistor fabrication, but only in the limited range of 10 to 400 ohms per square, depending on film thickness.

Therefore a continuing need exists for the development of thin film compositions providing a high value of sheet resistance, and an exceptionally low temperature coefficient of resistance. It is especially desirable that a composition be flexible in its ability to provide a wide range of sheet resistance values without depending primarily on film thickness to provide such flexibility.

THE INVENTION

Accordingly, it is an object of the present invention to provide a thin film resistor having a composition which satisfied the above compatibility requirements. It is a further object of this invention to provide a thin film resistance composition which is flexible in its ability to provide a wide range of sheet resistance values independently of film thickness.

It is a further object of the invention to provide an improved method for the vapor phase deposition of such resistor compositions.

It is a primary feature of the invention to prepare a thin film cermet resistor comprising a mixture of tungsten and tungsten oxide. More specifically, a gas plating system is operated at atmospheric pressure for passing a dilute stream of tungsten hexacarbonyl vapor in contact with a heated substrate to deposit a mixture of tungsten and tungsten oxide by pyrolytic decomposition. By the addition of varying amounts of oxygen to the carbonyl-comprising vapor, the sheet resistance of the deposited film can be selected within the range of 50 to 5,000 ohms per square.

The invention is embodied in an electrical resistance composition and structure comprising a dielectric substrate coated with a thin film composition comprising tungsten and tungsten-oxide. Preferably the film contains 0.01 to 10.00% oxide. The invention is further embodied in a method for depositing a mixture of tungsten and tungsten oxide on a substrate by contacting the substrate with a gaseous or vaporous mixture of an oxidizing agent, tungsten carbonyl and an inert carrier gas, while maintaining the substrate between 300° and 500° C.

In a preferred embodiment the substrate is a semiconductor structure coated with a dielectric layer, for example, silicon oxide; and the tungsten-tungsten oxide layer is deposited for the purpose of forming a thin film resistance pattern to be integrated with the remaining components, active and passive, of a semiconductor integrated circuit. The preferred reactant mixture consists essentially of tungsten hexacarbonyl, oxygen, and a carrier gas selected from the group consisting of hydrogen, nitrogen and argon.

The oxide coated semiconductor structure is placed in a reaction chamber maintained at atmospheric pressure and is located on a suitable heating block for the maintenance of a substrate temperature between 300 and 500° C., preferably 400 to 450° C. The partial pressure of the tungsten hexacarbonyl is from 0.100 to 10.0 millimeters of mercury, while the partial pressure of oxygen is maintained from 0.001 to 0.200 millimeter of mercury. The reactive gas mixture is preferably passed in a direction normal to the substrate surface in order to insure a uniform contact across the entire surface. This is usually achieved by releasing the reactant mixture through a distribution nozzle located near the surface to be coated. The nozzle may consist simply of a porous or perforated disk having an area at least as great as the surface to be coated and located a short distance therefrom.

The specific resistivity of the deposit is controlled by adjusting the partial pressure of oxygen in the reactive gas stream, and by adjusting the ratio of oxygen to tungsten hexacarbonyl vapor. For example, a partial pressure of 0.038 millimeter oxygen and 0.92 millimeter tungsten carbonyl produces a deposit having a resistivity of $2\times10^{-3}$ ohm-centimeters. The film thickness is typically in the range of 800 to 1400 angstroms, giving a sheet resistivity varying from 70 ohms per square to 1200 ohms per square. Films having a sheet resistivity as high as 5,000 ohms per square have been deposited.

The temperature coefficient of resistivity (TCR) of the deposited films varies from +480 to −1000 parts per million per degree centigrade, in the temperature range of 25 to 125° C. The TCR is primarily dependent on the oxide content of the tungsten-tungsten oxide composition and the grain size of the film. Greater concentration of oxide shifts the TCR to more negative values, while a smaller grain size tends to cause the same result. As mentioned above, the oxide content of the film is regulated by controlling the oxygen partial pressure of the reactant gases. The grain size is regulated by controlling the partial pressure of the tungsten carbonyl. A decrease in the carbonyl pressure yields a greater grain size. To some extent, the grain size can also be controlled by regulating the substrate temperature, with higher temperatures yielding increased grain size.

After formation, the tungsten-tungsten oxide resistance film is passivated by vapor deposited gas. When baked at 500° C. for 15 hours the passivated resistors are stabled to within 10% of their initial values. The delineation of resistor patterns is accomplished by direct etching with potassium permanganate/hydrogen fluoride solutions at room temperature.

THE DRAWING

A suitable system of apparatus for practice of the invention is shown in the accompanying drawing. A passivated semiconductor structure or other substrate 11 is placed on a heating block 12 within reaction chamber 13. The reaction gases are passed through nozzle 14 then in contact with the substrate, and are exhausted through lines 15 and 16. When hydrogen or other flammable carrier gas is used, a positive disposal means may be provided in the exhaust line such as burn-off filament 18. Ceramic-packed tube furnace 17 may be provided to decompose the carbonyl vapor.

The tungsten carbonyl source is placed in container 19 located within heated chamber 20. The carrier gas is introduced through flow meter 21 and line 22, then through chamber 20 at which point the vaporized tungsten carbonyl becomes entrained therewith. The partial pressure of tungsten carbonyl is regulated by controlling the temperature of chamber 20. Tungsten hexacarbonyl is a solid, having a sublimation temperature of about 150° C. Chamber 20 need not necessarily be operated at 150° C. or above, however, since the carbonyl has a significant vapor pressure at somewhat lower temperatures. Air or other oxygen-containing gas is introduced through flow meter 23 and line 24. Upon entering mixing chamber 25, the combined streams are passed through diffusor 26 which may be packed with ceramic beads or the like to improve the uniformity of mixing, prior to discharge from nozzle 14.

The temperature within diffusor 26 is kept well below the decomposition temperature of the carbonyl vapors by passing water through inlet 27 and jacket 28. Water flowing from jacket 28 through line 29 is used to heat chamber 20 as it passed through the jacket 30, and the remaining heat is then utilized to raise the temperature of the carrier gas by heat exchange within chamber 31. The water is discarded through line 32.

The flow rate of water through jackets 28, 30 and 31 is regulated in accordance with the heat requirements for evaporation of the tungsten carbonyl from container 19. That is, the temperature within jacket 30 is determined by means of a thermocouple 33 in response to which determination the flow rate of water is either increased to lower the temperature or decreased to raise the temperature within chamber 20.

What is claimed is:

1. An electrical resistance element having a resistance of from 50 ohms per square to 5000 ohms per square comprising a dielectric substrate coated with a tungsten film consisting of 90.00 to 99.99 percent tungsten and 0.01 to 10.0 tungsten oxide.

2. An electrical resistance element having a resistance of from 50 ohms per square to 5,000 ohms per square comprising a dielectric substrate coated with a low temperature coefficient of resistance film consisting of a mixture of 90.00 to 99.00% tungsten and 0.01 to 10.0% tungsten oxide.

References Cited

UNITED STATES PATENTS

| | | | |
|---|---|---|---|
| 3,504,325 | 3/1970 | Rairden III | 338—308 X |
| 3,251,712 | 5/1966 | Berger | 117—227 X |
| 2,885,310 | 5/1959 | Olson et al. | 117—107.2 X |

OTHER REFERENCES

Elyutin, V.P.; Pavlov, Yu. A.; Shulepov, V. I.; Myakisheva, T. G.: Electric Resistance of $V_2O_5$, $MoO_3$, and $WO_3$ Heated in a Hydrogen Atmosphere, in Chemical Abstracts, 57:13258f, 1962.
57:13258f, 1962.

ALFRED L. LEAVITT, Primary Examiner

C. K. WEIFFENBACH, Assistant Examiner

U.S. Cl. X.R.

117—106 R, 107.2 R; 338—308

UNITED STATES PATENT OFFICE

CERTIFICATE OF CORRECTION

Patent No. 3,669,737 Dated June 13, 1972

Inventor(s) Warren L. Brand

It is certified that error appears in the above-identified patent and that said Letters Patent are hereby corrected as shown below:

In the heading, after line 6, insert -- assignors to Motorola, Inc., Franklin Park, Ill., a corp. of Illinois -- .

Signed and sealed this 12th day of December 1972.

(SEAL)
Attest:

EDWARD M.FLETCHER,JR.
Attesting Officer

ROBERT GOTTSCHALK
Commissioner of Patents